United States Patent [19]

Vora et al.

[11] Patent Number: 5,061,986
[45] Date of Patent: Oct. 29, 1991

[54] SELF-ALIGNED EXTENDED BASE CONTACT FOR A BIPOLAR TRANSISTOR HAVING REDUCED CELL SIZE AND IMPROVED ELECTRICAL CHARACTERISTICS

[75] Inventors: Madhukar Vora, Los Gatos; Greg Burton, Mt. View; Ashok Kapoor, Palo Alto, all of Calif.

[73] Assignee: National Semiconductor Corporation, Santa Clara, Calif.

[21] Appl. No.: 476,149

[22] Filed: Feb. 5, 1990

Related U.S. Application Data

[63] Continuation of Ser. No. 88,632, Aug. 20, 1987, abandoned, which is a continuation of Ser. No. 693,062, Jan. 22, 1985, abandoned.

[51] Int. Cl.$^5$ ................ H01L 23/48; H01L 29/04; H01L 29/72
[52] U.S. Cl. ......................... 357/71; 357/67; 357/34; 357/59
[58] Field of Search ............ 357/67 S, 71 S, 59 I, 357/34

[56] References Cited

U.S. PATENT DOCUMENTS

| | | | |
|---|---|---|---|
| 4,080,719 | 3/1978 | Wilting | 29/571 |
| 4,121,240 | 10/1978 | Katto | 357/71 P |
| 4,124,934 | 11/1978 | DeBrebisson | 29/590 |
| 4,249,968 | 2/1981 | Gardiner et al. | 148/174 |
| 4,295,264 | 10/1981 | Rogers | 357/23.6 |
| 4,484,211 | 11/1984 | Takemoto | 357/59 |
| 4,521,952 | 6/1985 | Riseman | 357/67 S |
| 4,581,623 | 4/1986 | Wang | 357/71 S |
| 4,593,454 | 6/1986 | Baudrant | 357/67 S |
| 4,609,568 | 9/1986 | Koh et al. | 427/85 |
| 4,612,565 | 9/1986 | Shimizu | 357/59 I |
| 4,621,276 | 11/1986 | Malhi | 357/71 S |
| 4,657,628 | 4/1987 | Holloway et al. | 156/643 |
| 4,676,866 | 6/1987 | Tang et al. | 156/643 |
| 4,679,300 | 7/1987 | Chan | 357/23.6 |
| 4,690,730 | 9/1987 | Tang et al. | 156/643 |
| 4,746,219 | 5/1988 | Holloway et al. | 357/23.11 |
| 4,764,480 | 8/1988 | Vora | 437/54 |

FOREIGN PATENT DOCUMENTS

| | | |
|---|---|---|
| 0046371 | 2/1982 | European Pat. Off. |
| 0054259 | 6/1982 | European Pat. Off. |
| 0097595 | 1/1984 | European Pat. Off. |
| 0104616 | 4/1984 | European Pat. Off. |
| 2081507 | 2/1982 | United Kingdom |
| 2134706 | 8/1984 | United Kingdom |

OTHER PUBLICATIONS

IEEE IEDM Technical Digest, Dec. 1984 pp. 118-120 by Chen.
*IBM Technical Disclosure Bulletin* (Mar. 1985) 27(10A):5870-5875.
Electronics International, vol. 55, No. 25, Dec. 15, 1982, pp. 138-145, New York, US; R. Beresford: "Special Report IEDM Devices Meeting Probes the Limits of Semiconductors and Circuitry".
IBM Technical Disclosure Bulletin, vol. 21, No. 3, Aug. 1978, pp. 1250-1251, New York, US; V. L. Rideout: "Fabricating Low Resistance Interconnection Lines and FET Gates in a Single Step".
(List continued on next page.)

*Primary Examiner*—Mark Prenty
*Attorney, Agent, or Firm*—Townsend and Townsend

[57] ABSTRACT

There is disclosed herein a bipolar transistor structure having a self aligned extended silicide base contact. The contact extends to the position of a base contact window located outside the perimeter of the isolation island on a contact pad formed over the field oxide. This allows the size of the isolation island to be kept smaller and allows a smaller extrinsic base regions to be formed. The base contact is formed of titanium and titanium silicide where the titanium/silicide boundary is self aligned with the edge of the device isolation island. The silicide is formed by reacting the titanium which completely covers the exposed epitaxial silicon inside the isolation island. An anisotropically etched oxide sidewall spacer insulates the silicide from the sidewall of the silicide-covered, polysilicon emitter contact.

9 Claims, 8 Drawing Sheets

OTHER PUBLICATIONS

IBM Technical Disclosure Bulletin, vol. 26, No. 5, Oct. 1983, pp. 2597–2599, New York, US; H. Chao et al.,: "High Capacitance Dynamic Random–Access Memory Cell with Self-Aligned Storage Capacitor".

Siemens Forschungs-Und Entwicklungsbe-Richte, vol. 13, No. 5, 1984, pp. 202–207, Wurzburg; W. Muller et al.: "A 256 Kbit Dynamic RAM in Um Polycide Gate Technology with Laser Redundancy".

Tang et al., *VLSI Local Interconnect Level Using Titanium Nitride,* IEEE Int'l Electron Dev. Meeting, Nov. 30, 1985, pp. 590–593.

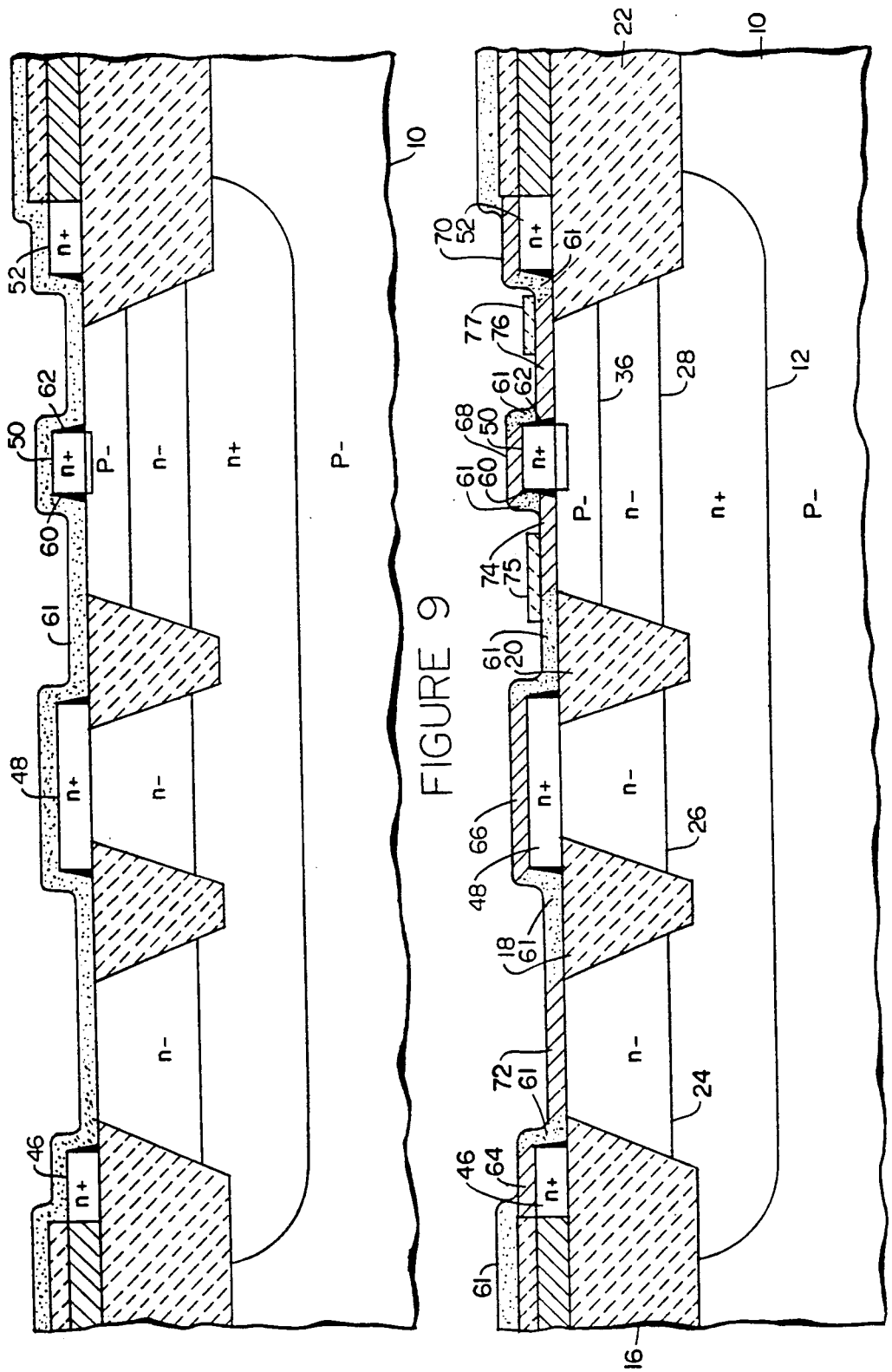

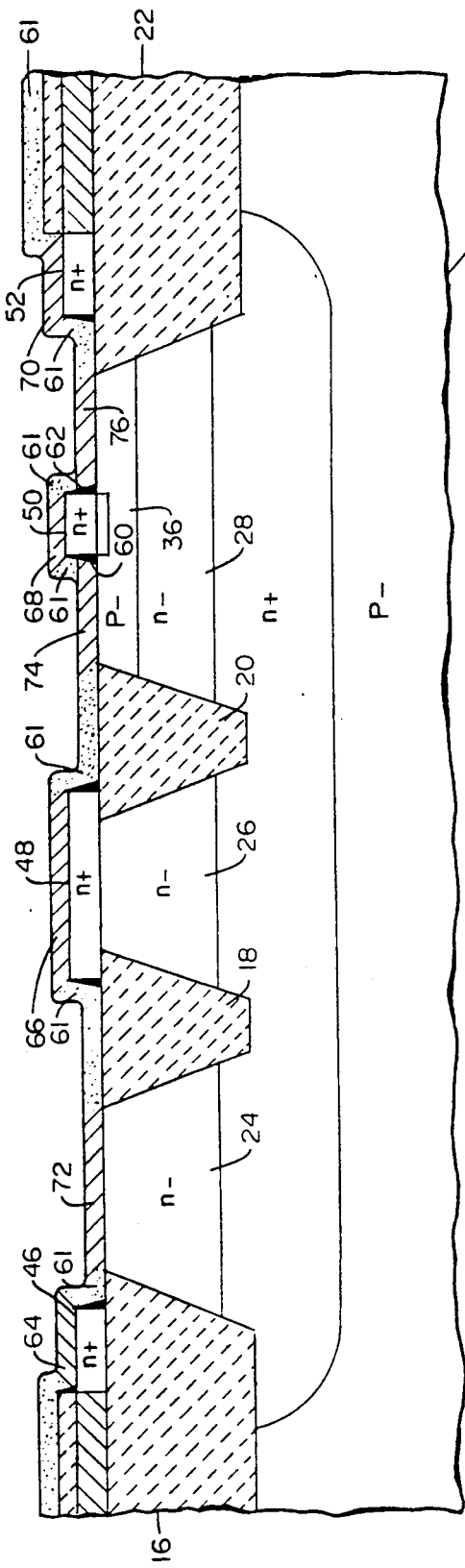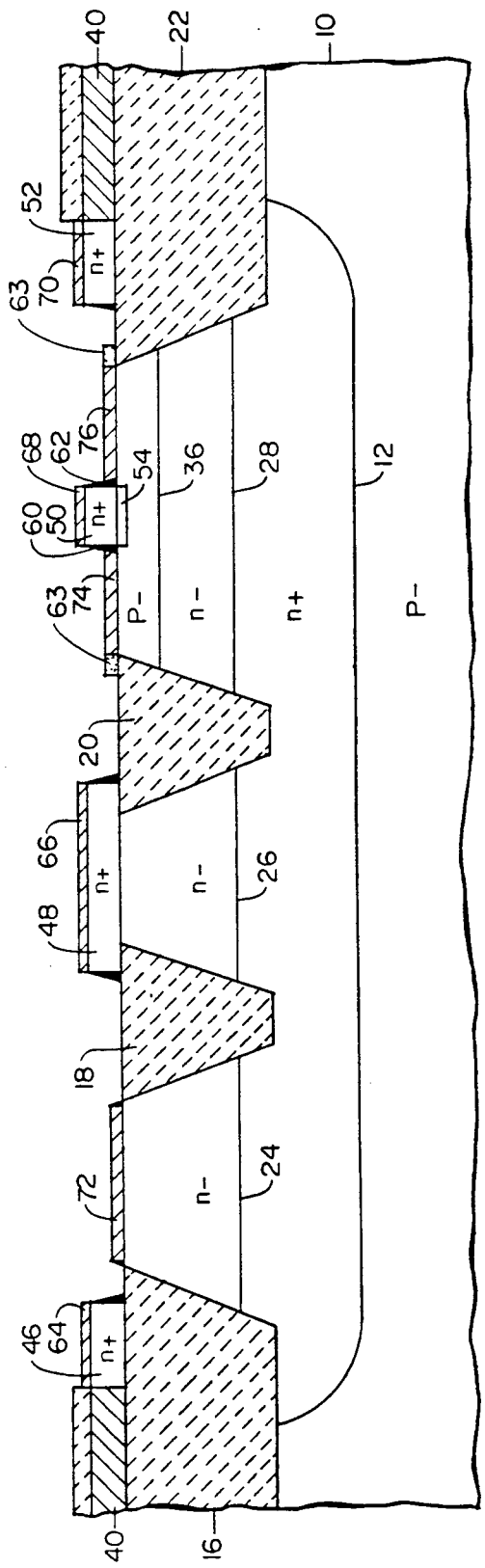

SELF-ALIGNED EXTENDED BASE CONTACT FOR A BIPOLAR TRANSISTOR HAVING REDUCED CELL SIZE AND IMPROVED ELECTRICAL CHARACTERISTICS

This is a continuation of application Ser. No. 088,632 filed Aug. 20, 1987, now abandoned which is continuation of application Ser. No. 693,062 filed Jan. 22, 1985, and now abandoned.

BACKGROUND OF THE INVENTION

1. Field of the Invention

This invention relates generally to integrated circuits and bipolar transistors formed therein, and relates more particularly to a structure for a bipolar transistor having its base contact outside the isolation region and having a self-aligned emitter-base spacer thereby reducing the transistor cell size and improving the transistor's electrical characteristics.

2. Background Information

Parasitic and inherent capacitances and resistances in integrated circuit structures are the principal limiting factors on switching speed and cutoff frequency. Some of these capacitances and resistances are parasitic, i.e., present only because of the integrated structure of the transistor. Others are inherently present because of the junction nature of a transistor and its peculiar geometry. For example, any transistor has a base spreading resistance caused by the long narrow path of current in the base to the emitter and collector junctions. In addition there is a parasitic resistance caused by the contact structure from the external base terminal to the base region of the transistor in the semiconductor lattice. Further, there is an emitter capacitance and a collector capacitance both of which arise from the presence of PN junctions in the device. The emitter and collector capacitances are the sum of the diffusion capacitances and the space charge capacitances across the emitter-base and base-collector junctions respectively. The areas of these junctions affect the value of these capacitances with larger areas causing larger capacitances. Therefore smaller transistors have smaller parasitic capacitances.

When a high frequency switching waveform is applied across the base-emitter junction of a swtching transistor, the emitter and collector capacitors tend to shunt the high frequency components for which these capacitances represent very low impedances. That is, when the switching waveform changes states, the capacitors tend to act as momentary shorts. When a transistor changes states from off to on or vice versa, the base current causes elimination of excess minority carrier charge stored in the base to cut the transistor off or causes storage of minority carrier charge to drive the transistor into saturation. Because of the low impedances of the emitter and collector junction capacitances, this base current is temporarily shunted therby diverting it from these functions. This diversion of the base current into these capacitors occurs until they are charges up, at which time the base current can commence charge storage or elimination of stored excess minority carrier charge. These charge storage or charge elimination events must occur before the transistor can change states from off to on or vice versa. Because there is no immediate change in state when the input waveform across the base-emitter junction changes state, there is no immediate change in the collector current. The collector current will not change until such time as the parasitic and inherent capacitors charge up and the charge in the base begins to change. This charging or discharging rate of the base is established by the sizes of the various capacitors and by the magnitude of the base spreading resistance through which the charging currents flow. The charging or discharging rate is the principal limitation on the switching speed of the transistor.

To maximize switching speed, the values of the capacitances must be minimized and the base spreading resistance must be kept low to provide a low RC time constant.

Workers in the art have devised processing techniques to yield transistor structures which have lower base spreading resistances than commonly found in prior bipolar transistor structures. Such an advance is described in a co-pending patent application entitled "Self Aligned Silicide Base Contact For A Bipolar Transistor", Ser. No. 629,039, filed Jul. 9, 1984. There the base spreading resistance was reduced by reducing the length of the path which current between the emitter and base had to travel. This reduction in path was caused by use of a self aligned base and emitter contacts of silicide separated by self aligned, thin oxide spacer insulator regions thereby eliminating the clearances between the base and emitter contacts that formarly had to be observed under the design rules for mask alignment tolerances in processes using separate base and emitter masks.

Although this process and structure lowers the base spreading resistance, it does not lower the parasitic and inherent emitter and collector capacitances associated with the integrated transistor structure.

The purpose of the present invention is to reduce the magnitude of parasitic and inherent capacitances associated with the integrated bipolar transistor structures previously known.

SUMMARY OF THE INVENTION

In accordance with the illustrated preferred embodiment, the present invention provides an improvement to a bipolar transistor with a self-aligned base-emitter contact spacer wherein the base contact window for the transistor is located outside of the isolation region of the transistor. Further, the metal conductor connecting the base contact window to the silicide base contact is self aligned and deposited during part of the silicide process to form the self aligned base-emitter contact spacer. The invention also includes a process for fabricating the self-aligned structure with the base contact window outside the confines of the isolation region. The advantage of this structure and process is that it provides an easy, high yield way to minimize the transistor cell size and thereby increase its switching speed by minimizing the emmiter-base and collector-base junction capacitances. These advantages are made possible by eliminating from within the base region of the transistor the contact window area required by the minimum feature size resolution of the photolithography process. Further, the extra area made necessary by design rule tolerances for mask alignment between the contact window mask and the isolation area, i.e., the base region definition mask which were previously necessary are also eliminated. The base contact window external to the cell allows the isolation region to be made smaller and therefore the areas of the base-emitter and base-collector junctions are smaller.

Having the base contact window outside of the base region requires contact by the base contact metal line to a second, lower metal layer which couples the base contact window to the silicide base contact portion over the base region of the transistor to establish the electrical connection to the base of the transistor. The second, lower metal layer is comprised of a portion of the metal which was used to form the silicide. The particular configuration of this second, lower metal layer is self aligned and established by a masking step prior to the metal etch step that removed the unused metal remaining after the silicide formation steps which were previously known.

Although the structure and the process are described herein with reference to n-p-n transistors, they apply to p-n-p transistors as well.

By placing the base contact window outside the perimeter of the active area defined by the isolation mask, several advantages arise. First, the active area can be made smaller because the area within the isolation mask perimeter need not include the area of the base contact window nor any clearances on the periphery of the base contact window dictated by the design rules to account for possible mask alignment failures. Second, because the base area is smaller, the junction capacitances and other parasitic capacitances and resistances which depend upon the base area are also smaller. This allows the transistor to switch at higher frequencies than previously were possible.

The process of the present invention is as follows. In the embodiment described herein, the base region is a lightly doped p− region within an epitaxial layer of the substrate. To form the emitter contact region, a layer of polycrystalline silicon is formed on top of the base region, and is then ion implanted to form a heavily doped n+region. The polycrystalline silicon is then patterned and etched photolithographically, forming an emitter contact region with substantially vertical side walls. An emitter region is then created below the emitter contact region by thermally diffusing the n-type impurities downward into the epitaxial layer. Next an oxide layer is formed over the emitter contact and base regions. The oxide layer is then anisotropically etched until the oxide has been removed from the upper or horizontal surfaces of the emitter and base regions. A residual amount of oxide remains on the side walls of the emitter contact region due to the anisotropic nature of the etching operation, which preferentially etches faster vertically than horizontally. Next, a layer of metal is deposited on the top of the substrate, and the structure is heat treated. Wherever metal and silicon atoms are in contact, such as along the exposed upper surface of the base region and on top of the emitter polysilicon, conductive metal silicide forms. After silicide formation, a layer of masking material is deposited on the wafer and photolithographically patterned to form a mask. This mask is needed to protect certain portions of the metal that was not converted to silicide from being etched away in the next step. The metal so protected is the metal which will form the conductor between the base silicide contact and the base contact window which will be formed later at a location outside the base region. After this metal patterning mask is formed, the excess, exposed metal is etched off the surface. Subsequently, the mask material is removed and oxide insulation is added by chemical vapor deposition to cover the whole surface of the wafer. Thereafter the base, emitter and collector contact windows are opened in the oxide in conventional manner and a metalization layer is deposited to define the interconnect pattern.

A major advantage of the process, besides its self alignment feature, is that Schottky diodes and tunnel emitters can be fabricated as well, thereby permiting great flexibility in circuit design.

BRIEF DESCRIPTION OF THE DRAWINGS

FIG. 9 is a sectional view of the semiconductor substrate after a layer of metal is deposited in preparation for formation of silicide base, collector and emitter contacts during the fabrication of the self-aligned bipolar transistor.

FIG. 10 shows the structure as shown in FIG. 9 after formation of the silicide contacts.

FIG. 11 is a sectional view of the semiconductor substrate after formation of the silicide contacts and formation of a metal etch protection mask.

FIG. 14 is a cross-sectional view of the substrate after the metal etch step to form the base contact conductor to the external base contact window and after removal of the metal mask.

DETAILED DESCRIPTION OF THE PREFERRED EMBODIMENT

The preferred embodimet of the present invention is a structure for a bipolar transistor having a smaller base region and, therefore, a smaller cell size and a self-aligning process for forming this structure. The transistor also uses a self-aligned metal silicide base contact and a self aligned, narrow base contact-emitter contact insulation spacer. The spacer oxide is a very thin layer of silicon dioxide that insulates between the side walls of the emitter contact region and the base contact. The base contact provides a conductor that covers the upper surface of the base region. The base contact window lies outside the boundaries of the cell. These elements will be described in more detail in conjunction with the following description of the process of the present invention. Although the structure and process of the present invention are described in terms of an n-p-n bipolar transistor formed on a p-silicon substrate, the scope of the invention is not to be taken as limited to only such devices and materials.

Although the formation of one transistor, one diode, and one resistor will be described, many such devices can be formed simultaneously on the wafer.

Figure 1:
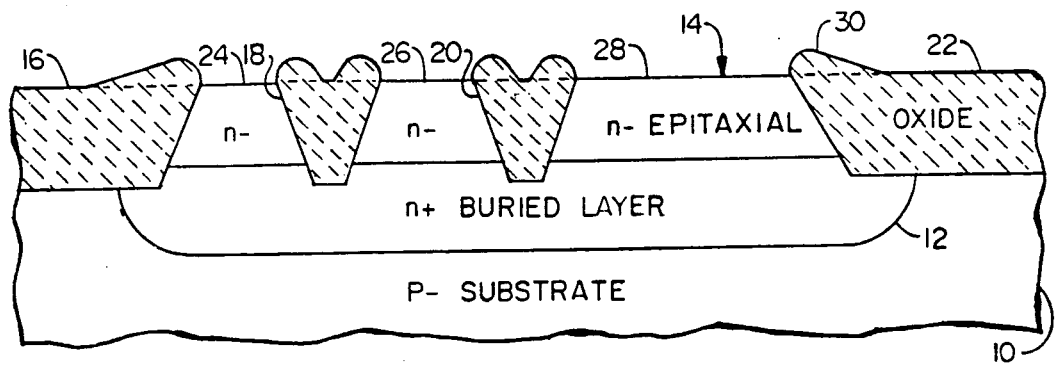
FIG. 1 is a sectional view of a semiconductor substrate after the field oxide formation step to define the base isolation area and the collector contact and Schottky diode areas in the epitaxial silicon layer during the fabrication of a self-aligned bipolar transistor.

FIG. 1 is a sectional view of a semiconductor substrate after the field oxide formation step to define the base isolation area and the collector contact and Schottky diode areas in the epitaxial silicon layer during the fabrication of a self-aligned bipolar transistor. A lightly doped p- silicon substrate 10 of <100> surface orientation provides the underlying semiconductor material of the wafer. A heavily doped n+ region is diffused or implanted into the upper surface of substrate 10 and forms an n+ buried layer 12. On top of buried layer 12, a monocrystalline silicon lightly doped n- region 14 is epitaxially grown. Next, field oxide regions 16, 18, 20, and 22 are formed by the following isoplanar process: (1) The upper surface of the epitaxial layer 14 is oxidized, then coated with a layer of silicon nitride. (2) Portions of the silicon nitride are patterned photolithographically and removed from areas where oxide barriers are desired. (3) The epitaxial layer is anisotropically etched to form pockets with slanted side walls. (4) The pockets are filled by thermally growing silicon dioxide upon the side walls and bottom surfaces of the pockets. (5) All residual silicon nitride is removed. The foregoing process steps are well known in the art. See, e.g. U.S. Pat. No. 3,648,125 issued to Doug Peltzer. Of course, other well known techniques may also be employed such as trench etching and filling. The field oxide regions divide the epitaxial layer into three separate islands 24, 26, and 28. Hereafter, all references to oxide and oxide material should be interpreted as references to silicon dioxide.

Forming the filled oxide regions in the manner described above creates an uneven upper surface. This happens because the oxide grows equally from all exposed silicon surfaces, which includes both the side walls and bottom surfaces of the pockets. Humps 30, commonly known as bird's heads are formed at the corners of the pockets. Subsequent processing steps can be performed with more accuracy, and with finer precision, if the bird's heads are removed to form a planar upper surface of the wafer. Although revoval is not mandatory, it is recommended. One technique for creating a planar upper surface is disclosed in U.S. patent application Ser. No. 576,665, filed Feb. 15, 1984 and now U.S. Pat. No. 4,539,744, "Semiconductor Planarization Process and Structures Made Thereby" invented by Greg Burton, and assigned to Fairchild Camera and Instrument Corporation.

Figure 2:
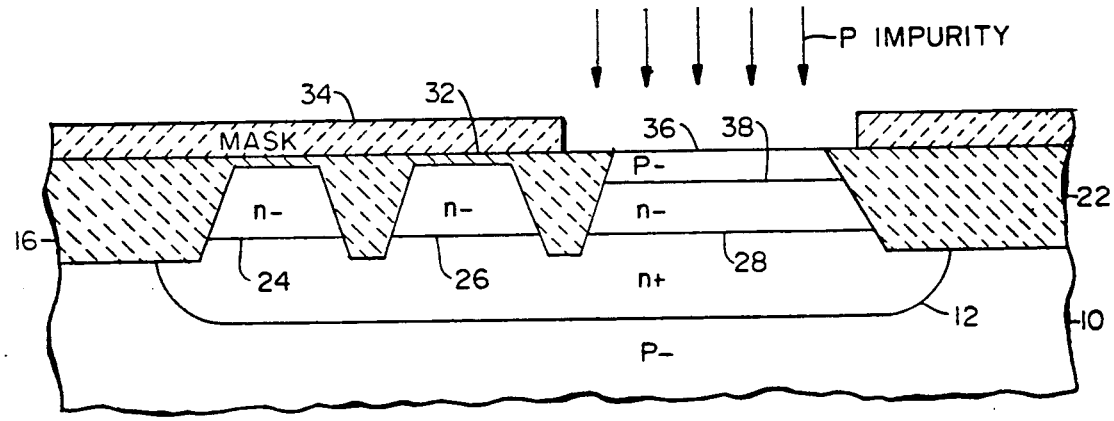
FIG. 2 is a sectional view of the semiconductor substrate after a second preliminary step in order to fabricate a base region during the fabrication of the self-aligned bipolar transistor.

FIG. 2 shows the structure after planarization and in a preliminary masking stage in preparation for forming the emitter and base regions. After planarization down to the flat surface of the epitaxial layer, a thin thermal oxide layer 32 is grown over epi islands 24, 26, and 28. The thickness of oxide layer 32 is not critical since it is used only as a shield during subsequent ion implantation. Next, a photomask layer 34 is applied, developed and configured on the upper surface of the wafer as illustrated to form an opening around the epi isolation island 28. Next, that portion of the thermal oxide layer 32 that is located above island 28 is removed by etching. Oxide layer 32 remains in place over islands 24 and 26. This leaves the structure as shown in FIG. 2. Then, island 28 is ion implanted with p type impurity atoms, such as, for example, boron. The impurity atoms form a lightly doped p— base region 36 on top of the remaining n— epitaxial region 38 of island 28.

Figure 3:
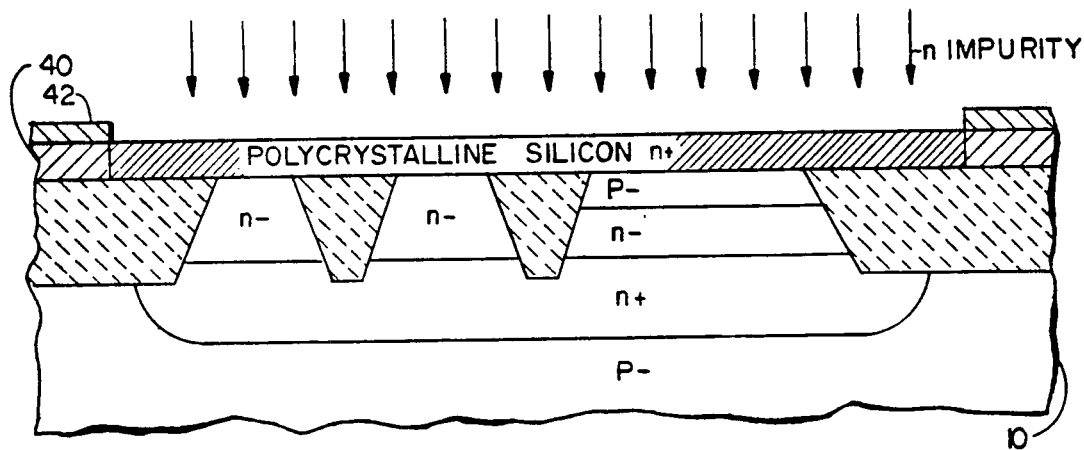
FIG. 3 is a sectional view of the semiconductor substrate after a third preliminary step in preparation for formation of an emitter stripe and emitter region during the fabrication of the self-aligned bipolar transistor.

In reference now to FIGS. 3 and 4, the formation of the emitter region will be described. First, the photomask layer 34 and the thermal oxide layer 32 are removed. Then, a layer of polycrystalline silicon 40 is deposited, for example, by chemical vapor deposition, on top of the wafer to a thickness of approximately 2500 to 5000 angstroms. N type impurity atoms are present during the formation of the poly layer 40, causing it to be a lightly doped n— material. Next, an oxide layer 42 is grown on top of the polycrystalline silicon layer. Oxide layer 42 is then photolithographically patterned and etched to expose portions of the polycrystalline silicon layer 40 overlying the diode, base and collector contact areas. Portions of oxide layer 42 remain to cover the remaining portions of the polycrystalline layer 40 that will later form the resistive elements of resistors. Next, the exposed portions of the polycrystalline silicon are ion implanted with n type (donor) impurity atoms to form a heavily doped n+ layer. The n type impurity atoms may be, for example, arsenic atoms. FIG. 3 shows the state of the wafer at this stage of the process.

Figure 4:
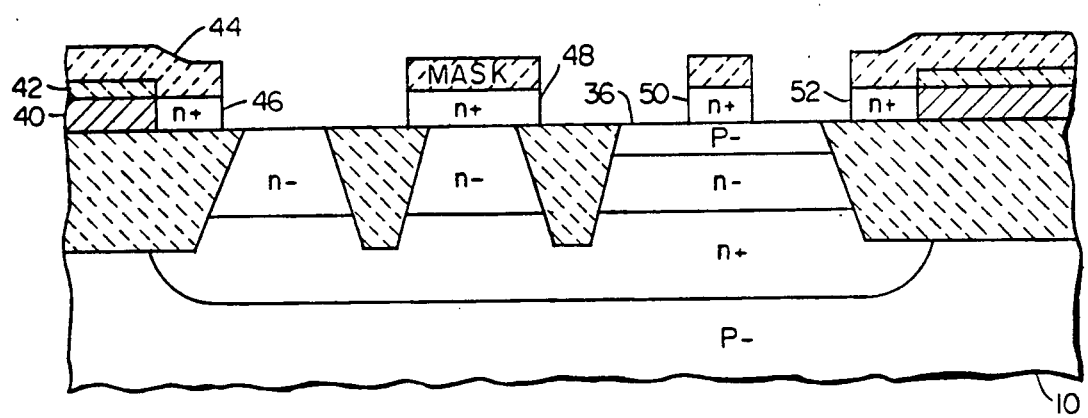
FIG. 4 is a sectional view of the semiconductor substrate after the emitter stripe is formed during the fabrication of the self-aligned bipolar transistor.

Another photolithographic step is next performed to define an emitter contact stripe 50 and the collector and resistor taps, as shown in FIG. 4. To accomplish this, another photomask layer 44 is applied to the top of the wafer. Photomask layer 44 is patterned by masking, and radiation exposure steps and portions thereof are removed to expose portions of the polycrystalline silicon layer 40. The exposed portions of the polycrystalline silicon layer are then etched away, leaving four n+ regions 46, 48, 50, and 52 still covered by masking material in the form of photoresist as shown in FIG. 4. N+ regions 46 and 52 form resistor taps, n+ region 48 forms a collector tap, and n+ region 50 forms an emitter contact region. All of the n+ regions have substantially vertical side walls.

At this point, the emitter contact stripe 50 extends upward from the upper surface of the base region 36. To form the transistor, an n+ emitter region must be created within the monocrystalline base region 36. To accomplish this, the wafer is heated so that some of the n+ impurities of the emitter contact stripe 50 diffuse downward into the base region 36. This downward diffusion forms an n+ emitter region 54 within the monocrystalline base region 36 of the substrate.

Figure 5:
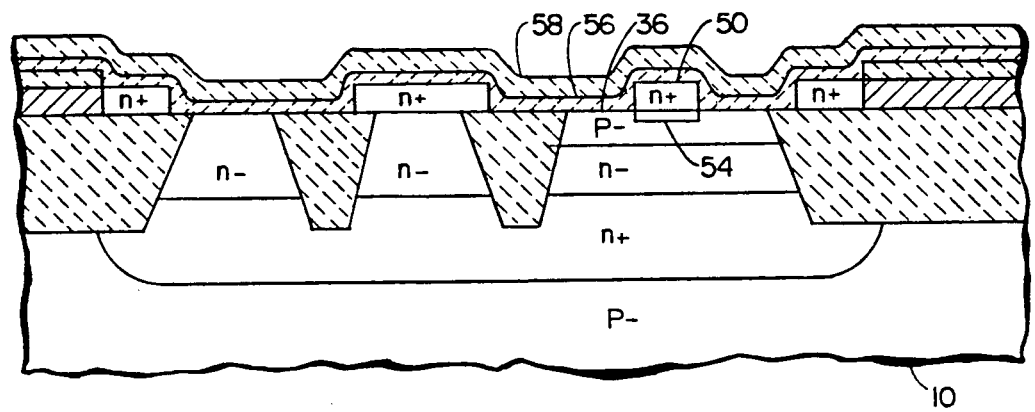
FIG. 5 is a sectional view of the semiconductor substrate after the emitter stripe is covered with two layers of silicon dioxide during the fabrication of the self-aligned bipolar transistor.
Figure 6:
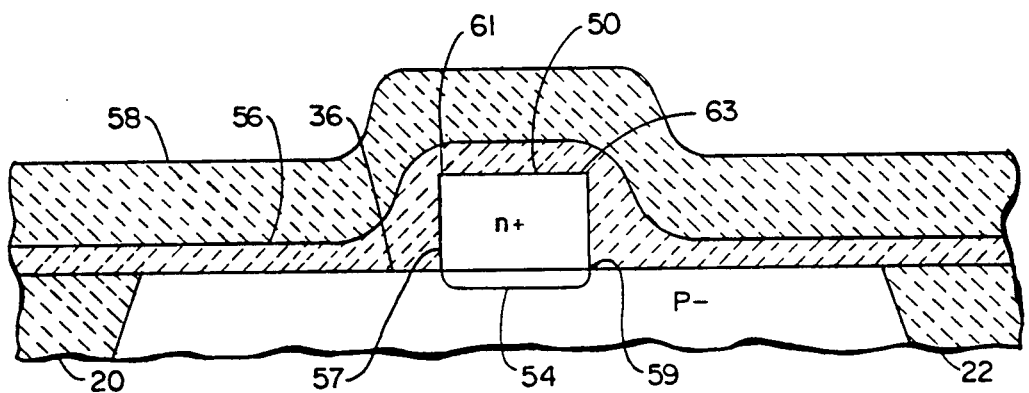
FIG. 6 is an enlarged sectional view of a protion of the semiconductor substrate shown in FIG. 5.

The formation of a double oxide layer over the whole wafer is the next step in the process of the present invention, and is illustrated in FIG. 5. After removal of the remaining photoresist 44, an oxide layer 56 of approximately 500 to 1000 angstroms thickness is thermally grown from the exposed silicon surfaces of the wafer. Then, another oxide layer 58 of approximately 2500 angstroms thickness is deposited on top of oxide layer 56. FIG. 6 shows the base and emitter regions 36 and 54 and coverage of the emitter contact stripe 50 by the oxide layers 56 and 58 is more detail. Oxide layer 56 is thicker at inside corners 57 and 59 in FIG. 6 and thinner at outside corners 61 and 63, and of some thickness between these two extremes along the flat surfaces such as on top of the emitter contact stripe 50. This thickness deviation occurs because the rate of oxide growth from all silicon sufaces is uniform, causing the oxide to pile up in the inside corners, and spread out from the outside corners.

It has been found to be advantageous to use a composite of two layers of oxide. The oxide layers serve two distinct functions. Firstly, the spacer oxide 60 and 62 (described below) will be formed from the inner oxide layer 56, so insulative integrity is critical. Since oxide layer 56 is thermally grown, it has a high integrity with virtually no pin holes. Secondly, an anisotropic etching process is used to form the spacer oxide, as described below. For the etching step to work properly, a thicker oxide layer than is readily formed thermally is required. Although the inner oxide layer 56 could be grown to sufficient thickness, it is quicker to deposit the outer oxide layer 58 to form the requisite thickness. The lower integrity of deposited oxide layer 58 does not impair the anisotropic etching process or the quality of the spacer oxide. In other embodiments of the process, layer 58 may comprise a refractory insulating material such as silicon nitride.

Figure 7:
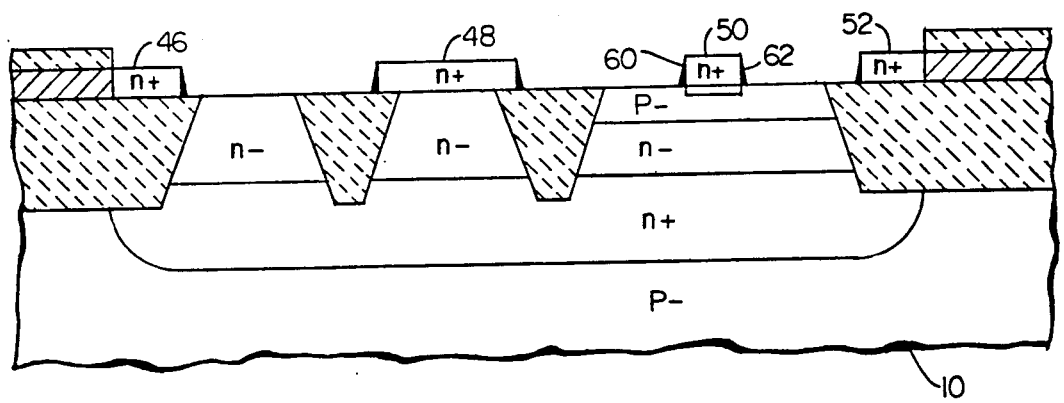
FIG. 7 is a sectional view of the semiconductor substrate after the emitter region and the base contact-emitter contact are formed by anisotropic etching during the fabrication of the self-aligned bipolar transistor.
Figure 8:
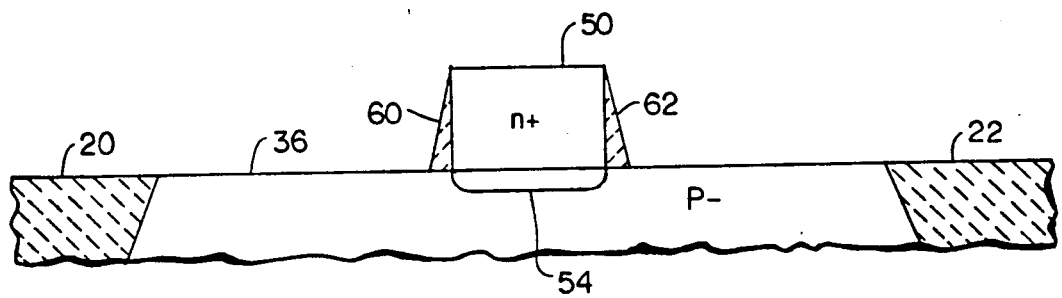
FIG. 8 is an enlarged sectional view of a portion of the semiconductor substrate show in FIG. 7.

The next step of the process is to form the emitter contact-base contact spacer oxide by anisotropic etching, as illustrated in FIGS. 7 and 8. Anisotropic etching is an etching process that preferentially etches in a vertical direction. In other words, its vertical etching rate is much greater than its horizontal etching rate. In the preferred embodiment of the present invention, anisotropic etching is performed by reactive-ion etching, a commonly used anisotropic etching process. Reactive-ion etching has the added advantage of a high silicon-to-silicon dioxide etch ratio, so that the desired removal of silicon dioxide occurs at a far faster rate than does the undesired removal of silicon. The reactive-ion etching of silicon dioxide over silicon is well known and may be carried out using commercially available equipment.

Anisotropic etching continues until all oxide is removed from the horizontal upper surfaces of the wafer. The etching process exposes the horizontal upper surfaces before it reaches the vertical side walls because the vertical thickness of the oxide is thinner above the horizontal sufaces than above the inside corners, and because the etching action is vertically preferential. When the oxide from oxide layers 56 and 58 has been removed from the horizontal upper surfaces of the wafer, a residual amount of oxide remains on the vertical side walls of n+ regions 46, 48, 50, and 52. The residual oxide 60 and 62 on the side walls of the emitter contact region 50 is the spacer oxide that will insulate between the emitter and the base contacts. The spacer oxide is thin near the upper surface of the emitter contact region, and increases in thickness toward the upper surface of the base region.

The thickness of the spacer oxide is controlled by the anisotropic etching process, and is not controlled by the limits of the photolithographic process. That is, the thickness of the spacer oxide is not limited by the alignment precision of the photolithography equipment. Three parameters control the thickness of the spacer oxide layer: vertical-to-horizontal etching ratio, duration of the etching process, and thickness of oxide layers 56 and 58. An anisotropic etching process with a lower vertical-to-horizontal etching ratio will form thinner spacer oxide layers than a process with a higher ratio. Also, increasing the duration of the etching process will form thinner spacer oxide layers. It has been found, for example, that a spacer oxide thickness of 2000 to 3500 angstroms at the upper surface of the base region is readily achieved.

FIGS. 9 and 10 illustrate the next step of forming the silicide base contact. First, a thin layer 61 of a metal described in more detail below, is deposited on the wafer as shown in FIG. 9. The thickness of this metal layer 61 in the preferred embodiment is 500 to 1000 angstroms. The wafer is then heat treated by heating to an elevated temperature for a time sufficient to form electrically conductive metal silicide. Metal silicide is a binary compound of silicon and a metal, and is formed at the elevated temperature wherever metal atoms are in contact wth silicon atoms. Metal silicide does not form where the metal layer contacts the oxide regions. As indicated in FIG. 10 by the cross hatched areas of metal layer 61, metal silicide does form on the polycrystalline silicon upper surfaces of n+ regions 46, 48, 50, ad 52, as well as on the epitaxial silicon upper surface of diode and collector n— regions 24 and 26, and on the silicon upper surface of the base p— region 36. The silicide thus formed is shown at 64, 66, 68, 70, 72, 74, and 76 in FIG. 10. Silicide does not form on top of the field oxide regions 16, 18, 20, and 22, nor does it form on the spacer oxide 60 and 62.

The metal used to form the silicide layers may be chosen from a wide range of candidates. If no subsequent high temperature processing is required, then nickel, palladium, or platinum may be used. If subsequent processing at a high temperature is required, such as is needed to flow a layer of reflow oxide, then a refractory metal such as titanium, vanadium, chromium, zirconium, niobium, molybdenum, hafnium, tantalum, or tungsten is preferred.

An additional step of ion implantation may be performed before heat treatment to improve the formation of silicide. That is, silicon atoms may be ion implanted into the metal layer utilizing an energy level that embeds the ions generally at the interface between the metal and underlying silicon. Silicide is formed at the interface by the implanted silicon atoms. The implantation allows more uniform silicide formation during subsequent heat treatment steps.

After the silicide has been formed, the metal layer 61 remains as metal over all the oxide regions, but has been converted to silicide over all moncrystalline and polycrystalline areas. Since the unconverted metal 61 is in self aligned electrical contact with the silicide over the base region 36, portions of this metal layer 61 can advantageously be used as a conductor making contact with the silicide base contacts 74 and 76 if the metal layer 61 is properly patterned. The next step is to form an etch protective masking layer of photoresist to so pattern the metal layer 61. It is desired to protect those portions of the metal layer 61 that are in electrical contact with the silicide base contacts 74 and 76 but to etch away all other portions of the metal layer 61. Further, the retained portions of the metal layer 61 must be configured so that the base contact window can be formed outside the confines of the base region.

Figure 12:
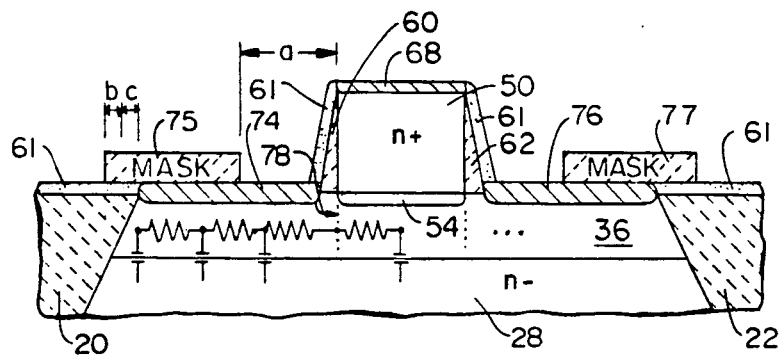
FIG. 12 is a cross-sectional view showing the base and emitter region of FIG. 11 in more detail and showing the relative position of the metal etch protection mask.

FIG. 11 illustrates in cross section, the mask layer used to accomplish this configuration of the metal layer 61. First a layer of photoresist (not shown) is deposited on the wafer in any known manner. Then a mask having the desired shape is aligned over the wafer, and the photoresist layer is exposed to an ultraviolet radiation source to polymerize the exposed portions of the photoresist. After polymerization of the photoresist, the unpolymerized resist is removed leaving only the polymerized portions of the resist on the wafer. The mask alignment was such that the photoresist which was left on the wafer is positioned as shown in FIG. 11 at 75 and 77. That is, the resist covers a portion of the base contact silicide 74 and 76 and extends from there to cover portions of the remaining metal layer 61 that are in electrical contact with the base contact silicide 74 and 76. An expanded cross sectional view of the base region 36 of the transistor cell shown in FIG. 11 is shown in FIG. 12 to more clearly indicate the relative position of the metal layer 61, the masking material 75 and 77 and the base contact silicide 74 and 76. FIG. 12 is a cross sectional view taken along the section line 12—12 FIG. 13.

Figure 13:
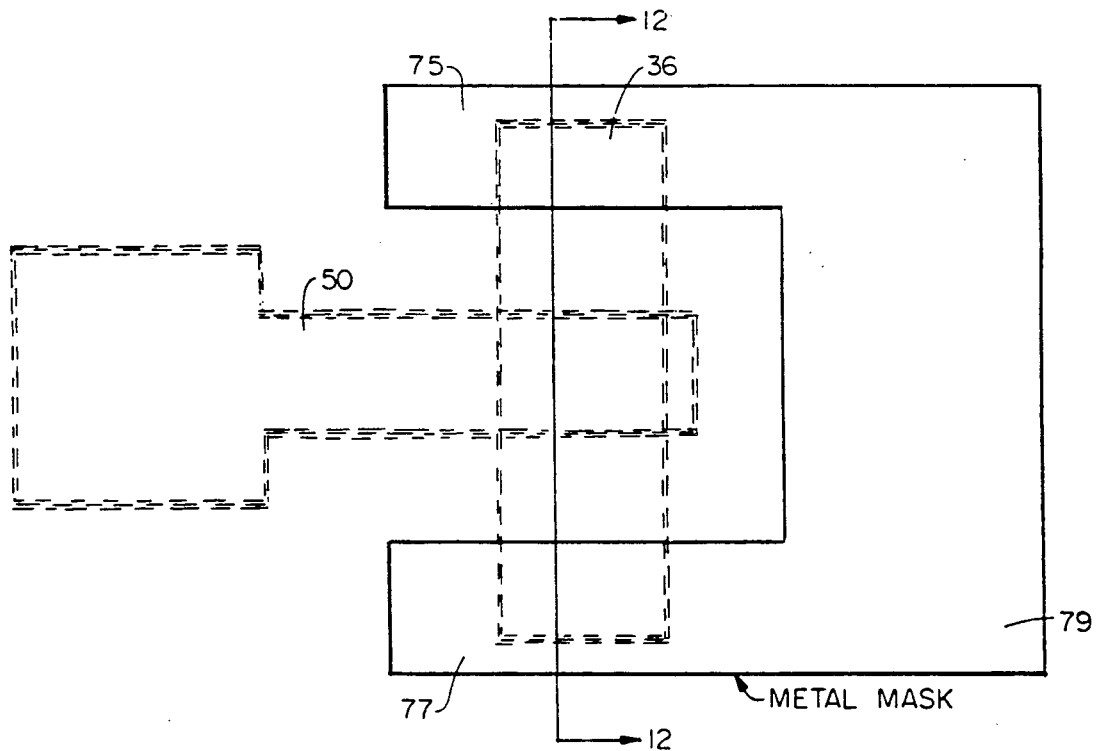
FIG. 13 is a top view of the region shown in FIG. 12.

FIG. 13 is a top view of the base/isolation region of the transistor showing the shape of the emitter stripe 50 and the shape of the metal layer mask. The isolation region 28 is coincident with the rectangular base region 36 which was formed as shown in FIG. 1. The polysilicon emitter stripe 50 is shaped and its mask is aligned so that the stripe portion extends over the center of the base region 36. The metal mask is formed in a U shape such that the two legs of the U 75 and 77 bracket the emitter stripe and cover portions of the base region 36 and a small portion of the metal layer 61 surrounding the base region 36. That is, in FIG. 13 all areas outside the base region 36 are to be understood as covered by the metal layer 61. All areas inside the base region 36 are covered with silicide. Thus all metal in the layer 61 under the mask legs 75 and 77 and under a contact window pad 79 of the metal mask is protected by a masking layer of photoresist.

After the silicide has been formed, some of the metal not reacting to form silicide is removed by chemically selective etching. The reaction temperature of metal-silicon is between 600 and 750 degrees Celsius for 10 minutes. Since the unreacted metal does not chemically bond with the underlying oxide, it is easily removed. The metal etch operation is intended to remove all metal in the metal layer 61 not protected by the metal mask portions 75, 77 and 79. Such etching procedures are well known as are all steps in the process defined herein. Examples of such techniques are found in "Semiconductor and Integrated Circuit Fabrication Techniques" by Peter Gise and Richard Blanchard published by Reston Publishing Company, Reston, VA, Library of Congress Number TK7871.85.F298 (1979), and "Integrated Circuit Fabrication Technology" by Elliott, Mcgraw-Hill Publ. Co., Library of Congress Number TK7874.E49 (1982), both of which are hereby incorporated by reference. The metal layer 61 can be any metal which will react with silicon and polysilicon to form a silicide which is sufficiently conductive so as to not degrade the electrical characteristics beyond a reasonable amount for the application. In the preferred embodiment, the metal layer is titanium. This etching step can be either a wet etch with hydrochloric acid or a plasma etch with PT-299 gas or wny other gas or wet etch compound which will work. Some specific etching guides are found at pages 260 to 268 of the Elliot reference.

After this metal etch step, the wafer is as shown in FIG. 14. All excess metal of the layer 61 is removed except that portion 63 which was under the metal mask portions 75, 77 and 79. Note that this etching step also removed the portions of the metal layer 61 which were covering the oxide spacers 60 and 62 best shown in FIG. 12. This removes the short circuit between the base and emitter contacts which would otherwise be caused by these portions of the metal layer 61. The remaining portions 63 of the metal layer serve as an electrical conductor connecting the silicide base contacts 74 and 76 to an area outside the active area, i.e., the isolation area 28 of the transistor.

Figure 15:
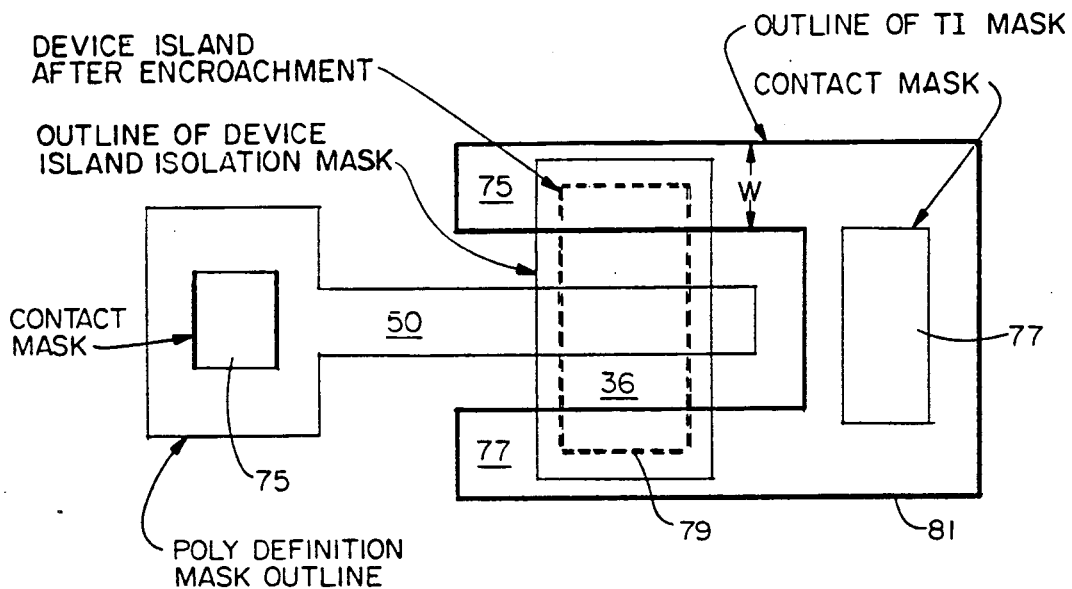
FIG. 15 is a top view of the various mask alignments for masks used at different levels of the structure.

After, the metal etching step, a thick oxide layer can be formed over the entire wafer in preparation for formation of contact windows. The contact windows are then formed in conventional manner. FIG. 15 shows the base and emitter portion of the structure in a plan view in preparation for formation of the contact windows down through the thick oxide layer to the emitter and base contact pads. The emitter contact window mask is shown at 75, and the collector window contact mask is shown at 77. FIG. 15 also clearly shows the outlines of the previously used masks to form the various levels of the structure, and shows the well known encroachment of the field oxide into the device isolation island. Only the area inside the encroachment line 79 is silicon. The area outside the encroachment line 79 is field oxide. Because the exact amount of encroachment by the field oxide into the base or isolation region is not known, it is important to align the metal mask 81 such that the inside edges of the legs 75 and 77 are as close as the design rules permit to the outside edges of the emitter stripe to insure that the metal mask 81 overlaps onto the silicide. If there is no overlap, the metal etching process to remove the remaining portions of the metal layer 61 may etch away parts of the metal layer which were not supposed to be etched, thereby creating a gap and open circuit in the metal conductor 63 which is supposed to connect the silicide base contact to the base contact window 77. It is also important to make the width W of the metal mask legs 75 and 77 wide enough to insure coverage of at least part of the metal layer 61 outside but in electrical contact with, the silicide base contact. If there is no overlap onto this metal, there will be an open circuit in the base contact. Of course, the closer the inside edges of the metal mask legs 75 and 77 can be aligned with the outside edges of the poly emitter stripe 50, the smaller can be made the base region 36 inside the encroachment line 79.

As seen best in FIG. 14, silicide layer 74 and 76 covers the upper surface of p— base region 36, except under the emitter contact region 50 and the spacer oxide regions 60 and 62. Self-alignment of the silicide to the spacer oxide is achieved because silicide is formed on all exposed silicon surfaces. Only the thickness of spacer oxide 60 separates silicide layer 74 from emitter contact region 50. Since silicide is an electrically conductive compound, it may be used as a base contact. By using silicide layer 74 as the base contact, the distance between the base contact and the emitter contact region is quite small, and equals the base thickness of spacer oxide 60. Accordingly, the parasitic base resistance of this structure is also quite small because the base current need only travel a very short distance between the base contact and the active area of the transistor. This distance is given by arrow 78 in FIG. 12. Note that photolithography limitations do not constrain this distance because anisotropic etching, not photolithography, defines the thickness of the spacer oxide.

Switching speed is also improved by the placement of the base contact 77 for this vertical transistor outside the confines of the base isolation region 36. This allows the base region isolation island 36 to be made smaller which means that the area of the base-emitter and base collector junctions is smaller. These smaller junction areas reduce the size of the emitter and collector junction capacitors. These capacitances are well known and are defined and quantized in the literature such as "Electronic Devices and Circuits" by Millman and Halkias, Mcgraw-Hill (1967), chapter 13 which is hereby incorporated by reference. The emitter junction capacitance is the dominant capacitance, and its value increases directly with increasing base cross-sectional area, see e.g., equation 13-12 at page 367 of Millman and Halkias. This emitter capacitance is the dominant factor in determining the switching speed and alpha cutoff frequency of the transistor. By eliminatiing from the base area, the area of the base contact window plus all the area consumed by its associated design rule alignment tolerances, the overall transistor cell size and the base isolation island size can be reduced from $4 \times 14$ microns in the prior art to $4 \times 6$ microns with the invention. This makes the inventive cell faster by a factor of 1.5 and smaller by a factor of 2 in cell area consumed.

Figure 16:
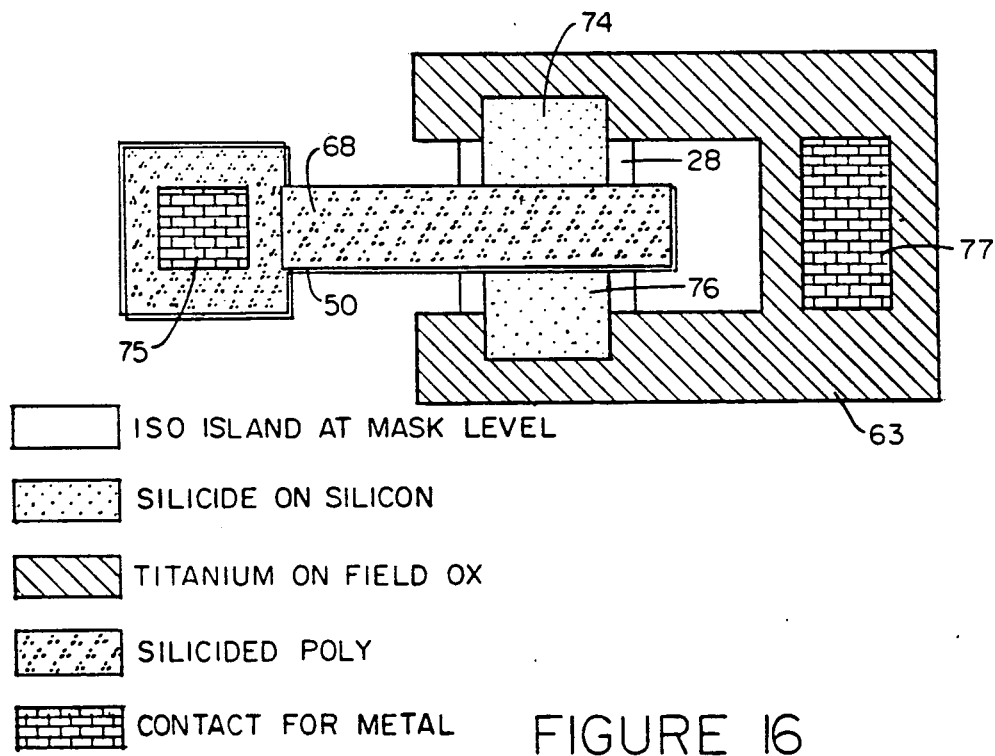
FIG. 16 is a top view of the completed structure.

A completed transistor is shown in FIG. 16 in plan view. Fabrication of the wafer is completed according to standard techniques. After the silicide is formed and all excess, unmasked metal is removed, an oxide layer is formed by a reflow oxide process, wherein heating to an elevated temperature is utilized to flow the oxide to form a planar upper surface for ease of photolithographically forming the contact windows. When such a process is used, then the silicide metal 61 must be a metal such as titanium, molybdenum, tungsten, or other refractory metal that will not melt at the high temperatures needed to reflow the oxide. Of course other planarization techniques for the insulator layer over the structure of FIG. 14 may be used where such high temperatures need not be used. In such an event, refractory metal for the layer 61 need not be used.

After the oxide or other insulating material layer is formed, it is photolithographically patterned, and contact window openings to the silicide emitter and collector layers and the base metal layer are etched. A metallization layer is then deposited, typically using aluminum, and patterned, and etched to form the electrical interconnections of the wafer, including vias. Finally, a passivation layer is deposited on the upper surface of the wafer.

The self-aligned metal silicide base contact structure of the present invention substantially improves the switching speed of this transistor by reducing its parasitic base resistance.

A Schottky diode is also formed by the above described process in the isolation island 24 of FIG. 14. The Schottky diode includes n− region 24, and silicide layer 72 forming a contact. Of course in the final device there is an oxide layer and a via formed through this oxide for an aluminum metallization layer to make contact to the silicide contact 72. The diode is formed during the formation of the transistor, and requires no additional processing steps. It can be interconnected as desired using the via and subsequent metallization layer. The collector contact via is formed over the isolation island 26 in FIG. 14 in a similar fashion.

Resistors may also be formed by the above described process. In FIG. 14, one end of the resistor can be contacted by forming a via to the silicide layer 64 contacting doped poly layer 46. This layer is in electrical contact with lesser doped poly layer 40 which can form the resistive element of the resistor. The same hold true for the silicide contact 70, the doped poly layer 52 and the layer 40 on the right side of FIG. 14. Layer 40 can extend to another connection that is similar to the one provided by n+ region 52, and silicide layer 70. The length and resistivity of layer 40 determines the value of the resistor. By permitting resistors and diodes to be constructed on the same wafer as fast bipolar transistors, the present invention provides a broad degree of design freedom to circuit designers.

Figure 17:
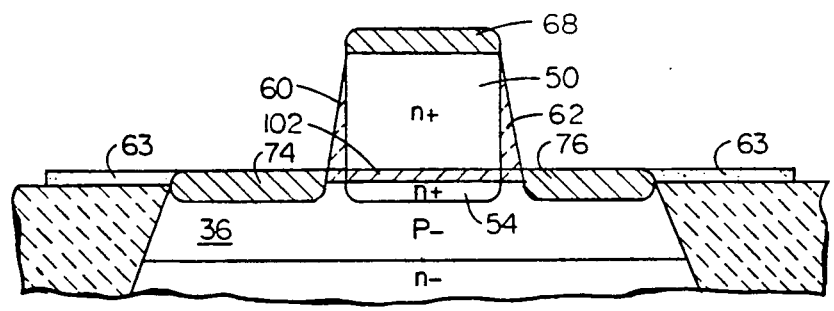
FIG. 17 illustrates a tunnel emitter alternative embodiment of the invention.

FIG. 17 illustrates a tunnel emitter alternative embodiment of a self-aligned silicide base contact structure. An n+ emitter contact region 50 with silicide emitter contact 68 and self aligned oxide spacers 60 and 62 is provided and manufactured as described above for the preferred embodiment. An additional thin oxide layer 102 is also provided separating the emitter poly stripe 50 from the n+ emitter region 54. The oxide layer 102 is formed after thermal oxide layer 32 (see FIG. 2) is removed and before polycrystalline silicon layer 40 (see FIG. 3) is applied. To form oxide layer 102, a thin oxide layer is first thermally grown upon the upper surface of p− base region 36 to a thickness of approximately twenty angstroms. The thin oxide layer is then patterned and etched to leave only layer 102, above which emitter contact region 50 will later be formed. After the polycrystalline silicon emitter 50 is formed, the wafer is heated to an elevated temperature to permit the n+ impurity atoms of the emitter to diffuse across oxide layer 102 and into the p− base region 36 to form n+ emitter region 54. Subsequent processing is performed according to the process described above. Tunnel emitter transistors are known to provide high current gain devices.

Figure 18:
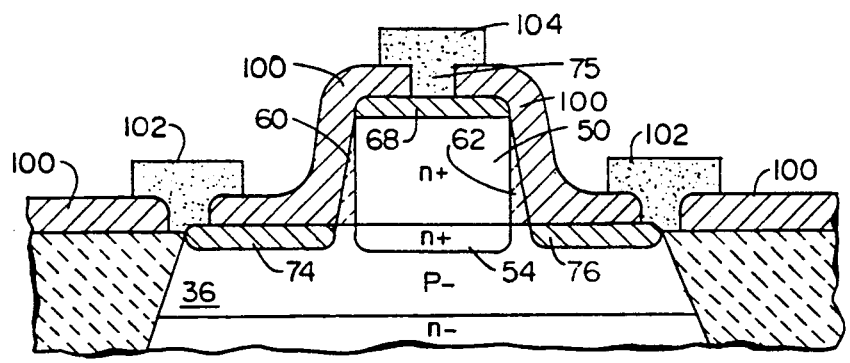
FIG. 18 illustrates an alternative embodiment utilizing a non-self aligned metal conductor in electrical contact with the silicide base tap leading to a base contact window pad external of the isolation island of the transistor.

FIG. 18 illustrates an alternative embodiment utilizing a non-self aligned metal conductor in electrical contact with the silicide base tap leading to a base contact window pad external of the isolation island of the transistor. In FIG. 18, the above described except ther is no metal etch protective mask 81 comprised of the parts 75,77 and 79 utilized to protect the portions 63 of metal layer 61 from being etched away. Therefore, these portions 63 are etched away leaving only the silicide layers 68, 74 and 76 in place. Thereafter, a layer of insulating material 100 is deposited on the surface of the wafer, and contact holes are etched in the layer 100 as shown in FIG. 18. These contact holes are cut using a via mask which is aligned such vias are cut down to the silicide layers 74 and 76 and so that a via is cut down to the silicide layer 68. A conductor such as aluminum or highly doped polysilicon is then deposited over the entire wafer, and is patterned with a metal mask such that a conductor 102 having the same shape as the metal on field oxide layer 63 in FIG. 16 is formed. The conductor is also patterned to form the emitter contact 104 in the emitter contact window 75. The resulting structure after these steps would be as shown in FIG. 18. Thereafter a base contact window 77 and base contact could be formed outside the perimeter of the isolation island 36 on a portion of the conductor layer 102 similar in shape to the portion 79 of the metal mask in FIG. 13 using conventional steps of insulating layer formation, contact hole etching and metal deposition and etching. Alternatively, the conductor layer 102 can be formed as the interconnect line to the base region 36.

Figure 19:
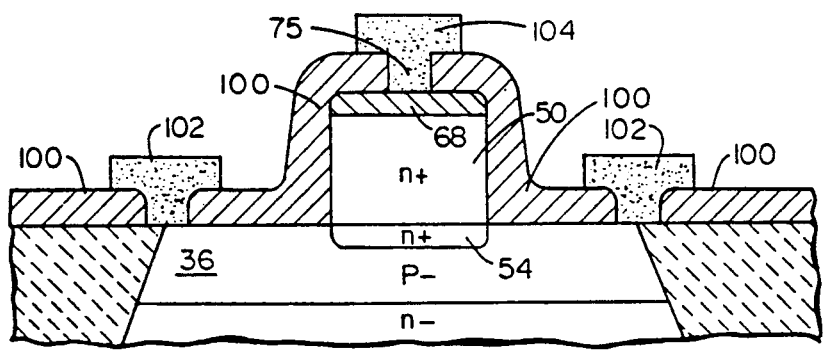
FIG. 19 illustrates an alternative embodiment using a non-self aligned metal conductor in electrical contact directly with the base region.

FIG. 19 illustrates an alternative embodiment using a non-self aligned metal conductor in electrical contact directly with the base region. The process of manufacturing this structure is slightly different than above described for the preferred embodiment because no silicide base taps 74 and 76 are used and therefore no self aligned spacer oxide 60 and 62 need be formed. To form the silicide 68 on top of the emitter stripe 50 in a self aligned fashion a added layer of nitride is formed on top of the polysilicon layer 40 in FIG. 3. Thereafter, when the poly emitter stripe 50 is etched, it has a layer of nitride on top which is self aligned with the edges of the stripe. Next, a thin layer of oxide is grown over the whole wafer. However oxide will not grow on nitride so the top of the emitter stripes remains covered with only nitride. Then a selective etch is used to etch away only the nitride leaving the top of the emitter poly stripe exposed. A metal layer is then deposited over the wafer surface and heat treatment causes the formation of the silicide layer 68 on the top of the poly emitter stripe. The oxide layer covering the rest of the wafer prevents silicide formation except in the desired locations, and thus the excess metal can be preferentially etched away easily. Since there is no silicide on the base region 36, there is no need to form the self aligned oxide spacers 60 and 62. Thereafter, the insulating layer 100 can be formed and the contact windows and metallization performed as described above with regard to FIG. 18. The shape of the metal or conductor layer 102 is as described above such the base contact window can be placed externally to the isolation island. Alternatively, the conductor layer 102 can be defined as the base contact conductor to connect the base to other nodes in the circuit.

From the above description, it will be apparent that the invention disclosed herein provides a novel and advantageous structure forming, and a process for fabrication, a self-aligned silicide base contact with a base contact window external of the transistor isolation island for a bipolar transistor. As will be understood by those familiar with the art, the invention may be embodied in other specific forms without departing from the spirit or essential characteristics thereof. For example, p-n-p transistors could be constructed by using the present invention. Or other semiconductor materials could be substituted for silicon. Further, other isolation schemes could be used which are well known withou departing from the true spirit of the invention. Accordingly, the disclosure of the present invention is intended to be illustrative, but not limiting, of the scope of the invention, which is set forth in the following claims.

What is claimed is:

1. An electrical contact for a semiconductor structure comprising:
   a first region in the semiconductor structure;
   an insulating region surrounding the first region;
   an electrically conductive contact layer disposed upon at least part of both the first region and the insulating region and consisting of metal silicide on the first region and metal on the insulating region, the metal silicide being contiguous to the metal; and
   a connection to the metal which, through the metal silicide, electrically connects to the first region.

2. A contact as in claim 1 further comprising:
   a polycrystalline silicon region, having sides and a top, disposed on the first region;
   a cap of metal silicide disposed on the top of the polycrystalline silicon region; and
   a spacer insulating region disposed on the sides of the polycrystalline silicon region, the electrically conductive contact layer on the first region extending to the spacer insulating region.

3. A contact as in claim 2 further comprising:
   an insulating layer disposed over the metal on the insulating region;
   an opening in the insulating layer to expose the metal thereunder; and
   wherein the connection to the metal is made through the opening in the insulating layer.

4. A contact as in claim 2 wherein:
   the first region is doped with first conductivity type impurity; and
   an opposite conductivity type region is disposed adjacent a surface of the first region directly beneath all of the polycrystalline silicon region.

5. A contact as in claim 2 wherein:
   the insulating region comprises silicon dioxide;
   the spacer insulating region comprises silicon dioxide; and
   the metal consists of a metal which will react with silicon to form said metal silicide.

6. A semiconductor structure comprising:
   a semiconductor substrate doped with first conductivity type impurity;
   a buried layer formed in the substrate doped with opposite conductivity type impurity;
   an epitaxial layer disposed over the buried layer and including a surface region doped with first conductivity type impurity;
   a contact layer disposed on the surface of the epitaxial layer and on the surface of an insulating region, the contact layer consisting of metal silicide where in contact with the epitaxial layer and consisting of metal where in contact with the insulating region.

7. A semiconductor structure as in claim 6 further comprising:
   an emitter region of opposite conductivity type disposed in the epitaxial layer adjacent the surface;
   a polycrystalline silicon emitter contact disposed on the epitaxial layer directly on the emitter region; and
   a further layer of metal silicide disposed on the polycrystalline silicon emitter contact.

8. A semiconductor structure as in claim 7 further comprising a sidewall insulating layer disposed about a periphery of the emitter contact and extending to the surface of the epitaxial layer to electrically separate the polycrystalline silicon emitter contact from the silicide on the epitaxial layer.

9. An electrical contact for a semiconductor structure comprising:
   a first region in the semiconductor structure;
   an insulating region surrounding the first region;

an electrically conductive contact layer disposed upon at least part of both the first region and the insulating region and consisting of metal silicide on the first region and unreacted metal on the insulating region, the metal silicide being contiguous to the metal; and a connection to the metal which through the metal silicide electrically connects to the first region.

* * * * *